(12) United States Patent
Melanson

(10) Patent No.: US 7,009,543 B2
(45) Date of Patent: Mar. 7, 2006

(54) MULTIPLE NON-MONOTONIC QUANTIZER REGIONS FOR NOISE SHAPING

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/994,617

(22) Filed: Nov. 22, 2004

(65) Prior Publication Data

US 2005/0156767 A1    Jul. 21, 2005

Related U.S. Application Data

(60) Provisional application No. 60/537,285, filed on Jan. 16, 2004, provisional application No. 60/539,132, filed on Jan. 26, 2004, provisional application No. 60/588,951, filed on Jul. 19, 2004.

(51) Int. Cl.
*H03M 3/00* (2006.01)

(52) U.S. Cl. .................................................. 341/143
(58) Field of Classification Search ............... 341/143, 341/155, 144, 138
See application file for complete search history.

(56) References Cited

U.S. PATENT DOCUMENTS

| | | | |
|---|---|---|---|
| 5,757,517 A | 5/1998 | Couwenhoven et al. ..... 358/463 |
| 6,154,121 A * | 11/2000 | Cairns et al. ................ 341/138 |
| 6,445,319 B1 * | 9/2002 | Bugeja ........................ 341/138 |
| 6,587,060 B1 * | 7/2003 | Abbey ......................... 341/143 |
| 6,760,573 B1 | 7/2004 | Subrahmanya et al. .. 455/192.2 |
| 2003/0086366 A1 | 5/2003 | Branlund et al. ........... 370/208 |
| 2003/0231729 A1 | 12/2003 | Chien et al. ................. 375/376 |

FOREIGN PATENT DOCUMENTS

JP       2003-124812      4/2003

OTHER PUBLICATIONS

Angus, James A.S., "Tree Based Lookahead Sigma Delta Modulators," Audio Engineering Society 114th Convention, Convention Paper 5825, Mar. 22-25, 2003.
Harpe, Pieter, et al., "Efficient Trellis-Type Sigma Delta Modulator," Audio Engineering Society 114th Convention, Convention Paper 5845, Mar. 22-25, 2003.
Hawksford, M.O.J., "Parametrically Controlled Noise Shaping in Variable State-Step-Back Pseudo-Trellis SDM," Audio Engineering Society 115th Convention, Convention Paper, Oct. 10-13, 2003.
Kato, Hiroshi, "Trellis Noise-Shaping Converters and 1-bit Digital Audio," Audio Engineering Society 112th Convention, Convention Paper 5615, May 10-13, 2002.

(Continued)

*Primary Examiner*—Peguy JeanPierre
(74) *Attorney, Agent, or Firm*—Hamilton & Terrile, LLP; Kent B. Chambers

(57) ABSTRACT

A signal processing system having a multiple non-monotonic regions quantization transfer function can improve overall delta sigma modulator performance. The non-monotonic quantization transfer function includes multiple quantization level retrograde changeover thresholds. Thus, the quantizer makes retrograde quantization level decisions for predetermined signal levels in multiple non-monotonic regions, i.e., for the $i^{th}$ non-monotonic quantization region $1 \leq i \leq N$, $N \geq 2$, and quantizer transfer function $Q(s)$, $Q(s1_i) \leq Q(s2_i)$ for a first set of quantizer input signals $|s1_i| > |s2_i|$ and $Q(s3_i) \leq Q(s4_i)$, for a second set of quantizer input signals $|s3_i| > |s4_i|$. The retrograde quantization level decisions for multiple non-monotonic regions, i.e. $Q(s3_i) \leq Q(s4_i)$, for $|s3_i| > |s4_i|$, effectively provide positive feedback to the delta sigma modulator input signal for each of the N non-monotonic regions and result in a more carefully defined gain for the delta sigma modulator.

25 Claims, 7 Drawing Sheets

OTHER PUBLICATIONS

Sony Electronics, Inc. and Philips Electronics N.V., "Super Audio Compact Disc, A Technical Proposal," 1997, no month.

J. Paulos et al., "Improved Signal-To-Noise Ratio Using Tri-Level Delta-Sigma Modulation," Reprinted from IEEE Proc. ISCAS, May 1987, pp. 245-248.

E. Knapen et al., "Lossless Compression of 1-Bit Audio," J. Audio Eng. Soc., vol. 52, No. 3, Mar. 2004, pp. 190-199.

A. J. Magrath et al., "A Sigma-Delta Modulator Topology with High Linearity," 1997 IEEE Int'l Symposium on Circuits and Systems, Jun. 9-12, 1997, Hong Kong, pp. 53-56.

* cited by examiner

MULTIPLE NON-MONOTONIC QUANTIZER REGIONS FOR NOISE SHAPING

CROSS-REFERENCE TO RELATED APPLICATION

This application claims the benefit under 35 U.S.C. § 119(e) of (i) U.S. Provisional Application No. 60/537,285, filed Jan. 16, 2004 and entitled "Look-Ahead Delta-sigma Modulators", (ii) U.S. Provisional Application No. 60/539,132, filed Jan. 26, 2004 and entitled "Signal Processing Systems with Look-Ahead Delta-Sigma Modulators", and (iii) U.S. Provisional Application No. 60/588,951, filed Jul. 19, 2004 and entitled "Signal Processing Systems with Look-Ahead Delta-Sigma Modulators". Provisional applications (i) through (iii) include example systems and methods and are incorporated by reference in their entireties.

BACKGROUND OF THE INVENTION

1. Field of the Invention

The present invention relates in general to the field of signal processing, and more specifically to a system and method for quantizing input signals using a delta sigma modulator that includes a non-monotonic quantizer.

2. Description of the Related Art

Many signal processing systems include delta sigma modulators to quantize an input signal into one or more bits. Delta sigma modulators trade-off increased noise in the form of quantization error in exchange for high sample rates and noise shaping. "Delta-sigma modulators" are also commonly referred to using other interchangeable terms such as "sigma-delta modulators", "delta-sigma converters", "sigma delta converters", and "noise shapers".

FIG. 1 depicts a conventional delta sigma modulator 100 that includes a monotonic quantizer 102 for quantizing a digital input signal x(n), where "x(n)" represents the $n^{th}$ input signal sample. The delta sigma modulator 100 also includes an exemplary fourth ($4^{th}$) order noise shaping loop filter 104 that pushes noise out the signal band of interest. For audio signals, the signal band of interest is approximately 0 Hz to 20 kHz. The four feedback coefficients c0, c1, c2, and c3 set the poles of both the noise transfer function (NTF) and the signal transfer function (STF) of filter 104. In an audio application, the STF is a low-pass and generally all pole function. The NTF of filter 104 has four (4) zeros at DC (0 Hz). Typical high performance delta sigma modulators include fourth ($4^{th}$) order and higher loop filters although filter 104 can be any order. The NTF distributes zeros across the signal band of interest to improve the noise performance of the delta sigma modulator 100.

FIG. 2 depicts the quantizer 102 modeled as a gain, g, multiplying the quantizer input signal s(n) plus additive white noise n. The quantizer output noise is then modeled as $n/(1+z^{-1}*g*H(z))$. However, the quantizer output noise model often breaks down because the gain g is actually dependent upon the level (magnitude) of the input signal x(n). For low level input signals x(n), a tendency exists for the feedback signal from the quantizer 102 to be low, effectively making the gain high or breaking down the quantizer output noise model altogether. Because one-bit quantizers have no defined gain, a high gain for low level quantizer input signals is particularly bad because it can decrease the signal-to-noise ratio (SNR) of the delta sigma modulator 100.

Referring to FIGS. 1, 2, and 3, the quantizer 102 quantizes an input signal x(n) monotonically by making a decision to select the closest feedback value to approximate the input signal. In a one-bit delta sigma modulator, the quantizer has only two legal outputs, referred to as −1 and +1. Therefore, in a one-bit embodiment, quantizer 102 quantizes all positive input signals as a +1 and quantizes all negative input signals as −1. The quantization level changeover threshold 304 is set at DC, i.e. 0 Hz, and may be quantized as +1 or −1.

FIG. 3 graphically depicts a monotonic, two-level quantization transfer function 300, which represents the possible selections of each quantizer output signal y(n) from each quantizer input signal s(n). The diagonal line 302 depicts a monotonic unity gain function and represents the lowest noise quantization transfer function. "Monotonic" is defined by a function that, as signal levels increase, consists of either increasing quantizer output state transitions ("transitions") or decreasing transitions, but not both increasing and decreasing transitions. To mathematically define "monotonically increasing" in terms of quantization, if the transfer function of the quantizer 102 is denoted as Q(s), then $Q(s1) \geq Q(s2)$, for all s1>s2, where "s1" and "s2" represent quantizer input signals. Mathematically defining "monotonically decreasing" in terms of quantization, if the transfer function of the quantizer 102 is denoted as Q(s), then $Q(s1) \geq Q(s2)$, for all s1<s2. Thus, in general, a monotonic quantization transfer function must adhere to Equation 1:

$$Q(s1) \geq Q(s2), \text{ for all } |s1|>|s2|. \quad \text{[Equation 1]}$$

In many cases, dithering technology intentionally adds noise to the quantizer input signal s(n) to dither the output decision of quantizer 102. Adding dithering noise can help reduce the production of tones in the output signal y(n) at the cost of adding some additional noise to the delta sigma modulator loop because the quantization noise is generally increased. However, adding dithering noise to the quantizer does not convert a monotonic quantization transfer function into a non-monotonic quantization transfer function. Adding dithering noise merely changes the probability of some quantizer decisions. An alternative perspective regarding dither is to simply add a signal prior to quantization, which has no effect on the quantization transfer function.

Magrath and Sandler in *A Sigma-Delta Modulator Topology with High Linearity*, 1997 IEEE International Symposium on Circuits and Systems, Jun. 9–12, 1987 Hong Kong, (referred to as "Magrath and Sandler") describes a sigma-delta modulator function that achieves high linearity by modifying the transfer function of the quantizer loop to include bit-flipping for small signal inputs to the quantizer. Magrath and Sandler discusses the compromise of linearity of the sigma-delta modulation process by the occurrence of idle tones, which are strongly related to repeating patterns at the modulator output and associated limit cycles in the system state-space. Magrath and Sandler indicates that injection of a dither source before the quantizer is a common approach to linearise the modulator. Magrath and Sandler discusses a technique to emulate dither by approximately mapping the dither onto an equivalent bit-flipping operation.

FIG. 4 graphically depicts the single non-monotonic region quantization transfer function 400 that emulates dither as described by Magrath and Sandler. Quantizer function 400 is necessarily centered around s(n)=0, as described by Magrath and Sandler, to emulate conventional dither. According to Magrath and Sandler, if the absolute value of the input ("|s(n)|" in FIG. 1) to the quantizer is less than B, a system constant, then the quantizer state is inverted as depicted by quantizer function 400.

Input signals s(n) to the quantizer 102 can be represented by probability density functions (PDFs). FIG. 5A depicts PDFs of each quantizer input signal s(n) during operation at small and large input signal levels. PDF 502 represents small signal levels for each signal s(n). The narrow PDF 502 can indicate high delta sigma modulator loop gain g. As the magnitude of signal levels for signal s(n) increase, the PDF of each signal s(n) changes from the narrow PDF 502 to the wider PDF 504.

FIG. 5B depicts a near ideal PDF 500 for each quantizer input signal s(n) because all signals are clustered around the quantization levels +1 and −1. Accordingly, the quantization noise n (error) is very small.

SUMMARY OF THE INVENTION

In one embodiment of the present invention, a signal processing system includes a delta sigma modulator. The delta-sigma modulator includes a non-monotonic quantizer to quantize an input signal to the quantizer in accordance with a multiple non-monotonic region quantization transfer function.

In another embodiment of the present invention, a method of non-monotonically quantizing an input signal using a delta sigma modulator includes quantizing an input signal to a quantizer of the delta sigma modulator in accordance with a multiple non-monotonic region quantization transfer function.

In another embodiment of the present invention, a signal processing system includes an input signal source to generate an input signal and one or more preprocessing components coupled to the input signal source to process the input signal. The signal processing system further includes a delta sigma modulator coupled to the one or more preprocessing components to quantize the input signal. The delta sigma modulator includes a noise shaping filter to filter an input signal and a quantizer feedback signal and a quantizer coupled to the noise shaping filter to quantize an input signal to the quantizer in accordance with a multiple non-monotonic region quantization transfer function. The signal processing system further includes one or more post processing components coupled to the delta sigma modulator to process a quantized input signal.

In another embodiment of the present invention, an apparatus includes means for quantizing an input signal to a quantizer of a delta sigma modulator in accordance with a multiple non-monotonic region quantization transfer function.

In another embodiment of the present invention, a signal processing system includes a delta sigma modulator. The delta-sigma modulator includes a one-bit, non-monotonic quantizer having a static quantization transfer function that includes more than three transitions.

In another embodiment of the present invention, a method of non-monotonically quantizing an input signal using a delta sigma modulator, including quantizing an input signal to a one-bit quantizer of the delta sigma modulator in accordance with a static quantization transfer function that includes more than three transitions.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system having a multiple non-monotonic regions quantization transfer function that improves overall delta sigma modulator performance by making a slightly worse short-term quantization decision in exchange for making better long-term decisions. The non-monotonic quantization transfer function includes multiple quantization level retrograde changeover thresholds. Thus, the quantizer makes retrograde quantization level decisions for predetermined signal levels in multiple non-monotonic regions, i.e., for the $i^{th}$ non-monotonic quantization region $1 \leq i \leq N$, $N \geq 2$, and quantizer transfer function $Q(s)$, $Q(s1_i) \leq Q(s2_i)$ for a first set of quantizer input signals $|s1_i|>|s2_i|$ and $Q(s3_i) \leq Q(s4_i)$, for a second set of quantizer input signals $|s3_i|>|s4_i|$. Rather than merely generating a single non-monotonic region for the purpose of emulating dither, the retrograde quantization level decisions for multiple non-monotonic regions, i.e. $Q(s3_i) \leq Q(s4_i)$, for $|s3_i|>|s4_i|$, effectively provide positive feedback to the delta sigma modulator input signal for each of the N non-monotonic regions and result in a more carefully defined gain for the delta sigma modulator. In one embodiment, the quantization level retrograde changeover thresholds of each non-monotonic region are located at multiple quantizer input signal levels where the quantizer gain, g, causes a perceivable decrease in the input signal signal-to-noise ratio. Thus, the probability density function of the quantizer input signals can more closely approximate an ideal probability density function.

Figure 6:
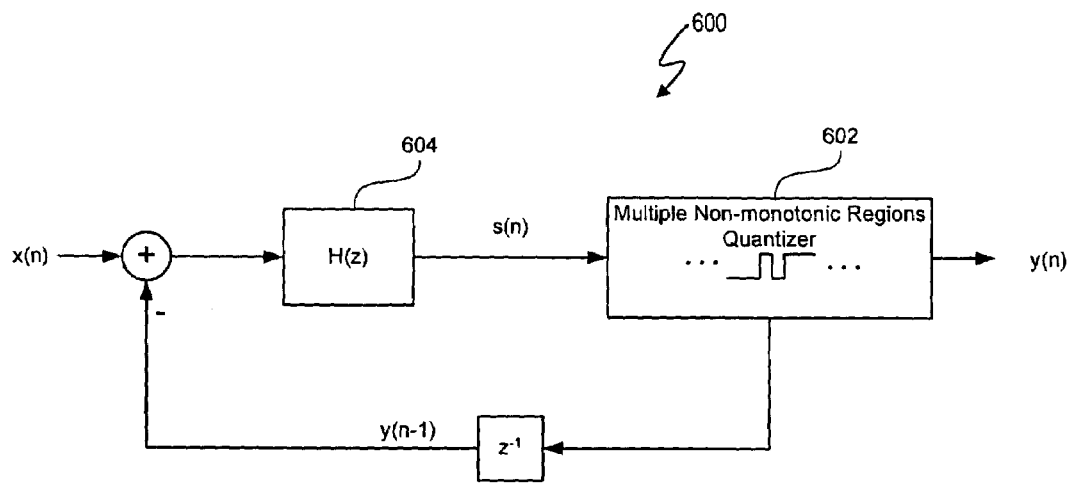
FIG. 6 depicts an exemplary delta sigma modulator that quantizes quantizer input signals in accordance with a multiple non-monotonic regions quantization transfer function.

FIG. 6 depicts a delta sigma modulator 600 that quantizes each quantizer input signal s(n) with a quantizer 602 that operates in accordance with a multiple non-monotonic regions quantization transfer function. Filter 604 processes each delta sigma modulator input signal x(n) minus a delayed quantizer output signal y(n), i.e. x(n)−y(n−1), to generate the quantizer input signal s(n). Filter 604 can be any noise-shaping filter, such as filter 104. Quantizer 602 quantizes input signal s(n) in accordance with a multiple non-monotonic region quantization transfer function. In positive quantizer feedback regions directly on either side of the quantization level retrograde changeover threshold, e.g. the signal level ranges represented by signals $s1_i$ and $s2_i$ in FIG. 8, the feedback signal becomes −y(n−1), and, thus, the filter input signal becomes x(n)+y(n−1). Filter 604 can be implemented using any topology, such as feed-forward or feedback topologies. Example loop filters are described in "Delta-Sigma Data Converters—Theory, Design, and Simulation", edited by Norsworthy, et al., 1997, IEEE Press, and ISBN 0-7803-1045-4.

Figure 7:
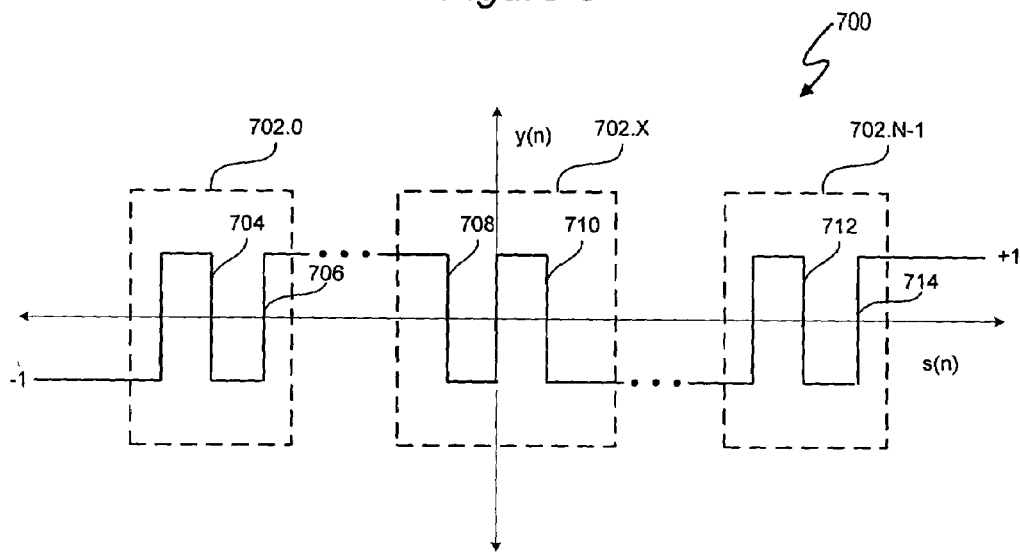
FIG. 7 depicts an exemplary multiple non-monotonic regions, two-level quantization transfer function.

FIG. 7 graphically depicts a two-level static quantization transfer function 700 of a one-bit delta-sigma modulator. The quantization transfer function 700 includes more than three transitions for the quantization of the quantizer input signal s(n). In one embodiment, quantization transfer function 700 is an N-region non-monotonic, two-level quantization transfer function 700. The quantization transfer function 700 represents the possible selections of a quantizer output signal y(n) from a quantizer input signal s(n) including selections from each non-monotonic region 702.0, 702.X, through 702.N−1, for N≧2.

Each non-monotonic, two-level quantization transfer function 700 includes two (2) quantization level retrograde changeover thresholds. For example, the quantization level retrograde changeover thresholds of non-monotonic region 702.0 are at the values of quantizer input signal s(n) depicted at 704 and 706. The quantization level retrograde changeover thresholds of non-monotonic region 702.X are at the values of quantizer input signal s(n) depicted at 708 and 710, and the quantization level retrograde changeover thresholds of non-monotonic region 702.N−1 are at the values of quantizer input signal s(n) depicted at 712 and 714. At a quantization level retrograde changeover threshold, the slope direction of the quantization transfer function reverses relative to a monotonic function. The distribution of non-monotonic regions and the dimensions of each non-monotonic region is a matter of design choice. In one embodiment, the quantization level retrograde changeover thresholds of each non-monotonic region are located at multiple quantizer input signal levels where the quantizer gain, g, causes a perceivable decrease in the input signal signal-to-noise ratio. In one embodiment, the quantization level retrograde changeover threshold 716 is set to s(n)=0 and the other quantization level changeover thresholds 708 and 710 are respectively set to $s(n)_{min}/8$ and $s(n)_{max}/8$, where $s(n)_{min}$ represents the minimum possible value of s(n) and $s(n)_{max}$ represents the maximum possible value of s(n). Further increasing the number of quantization level retrograde changeover thresholds in a non-monotonic quantization transfer function of a delta sigma modulator at least marginally improves the SNR of the delta sigma modulator.

Figure 8:
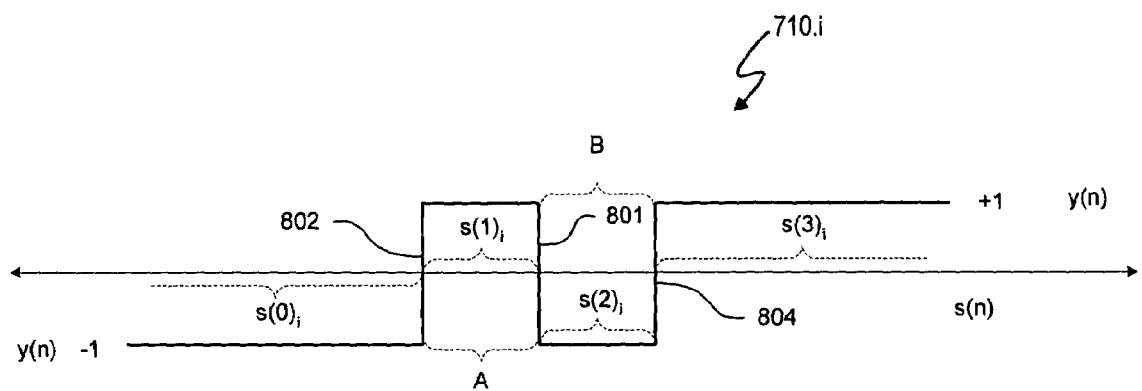
FIG. 8 graphically depicts exemplary a non-monotonic, two-level quantization region.

FIG. 8 depicts the $i^{th}$ non-monotonic quantization region 710.i. The transfer function Q(s) of quantizer 602 quantizes signal s(n) in accordance with a multiple non-monotonic regions quantization transfer function:

For each non-monotonic quantization region 710.i:

$Q(s0_i) \neq Q(s1_i)$, for $|s0_i| \neq |s1_i|$, $Q(s2_i) \neq Q(s3_i)$, for $|s2_i| \neq |s3_i|$, and $|s0_i| \neq |s1_i| \neq |s2_i| \neq |s3_i|$. [Equation 2]

For example, $Q(s0_i) = -1$, $Q(s1_i) = +1$, $Q(s2_i) = -1$, and $Q(s3_i) = +1$ represents one operational embodiment for the $i^{th}$ non-monotonic region of multiple non-monotonic region quantizer 602 for quantizer input signal ranges $s0_i < s1_i < s2_i < s3_i$.

Figure 1:
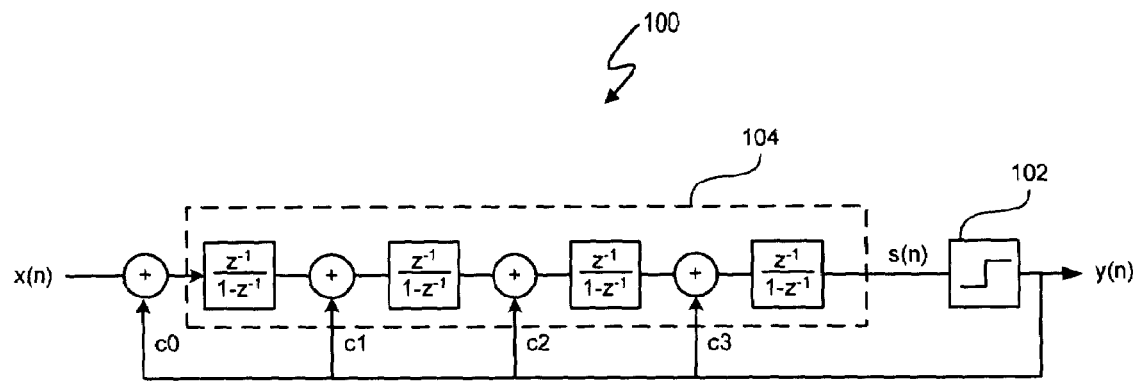
FIG. 1 (labeled prior art) depicts an exemplary delta sigma modulator with a monotonic quantizer.
Figure 2:
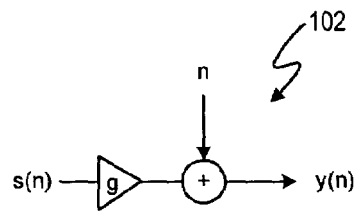
FIG. 2 (labeled prior art) depicts an exemplary delta sigma modulator quantizer model.
Figure 3:
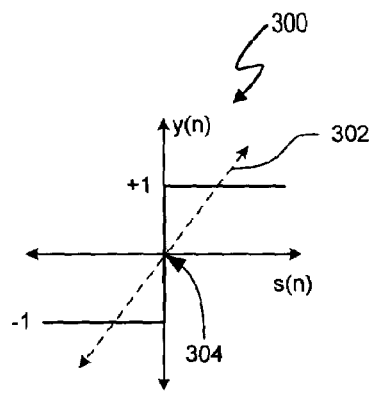
FIG. 3 (labeled prior art) depicts an exemplary monotonic, two-level quantization transfer function.
Figure 4:
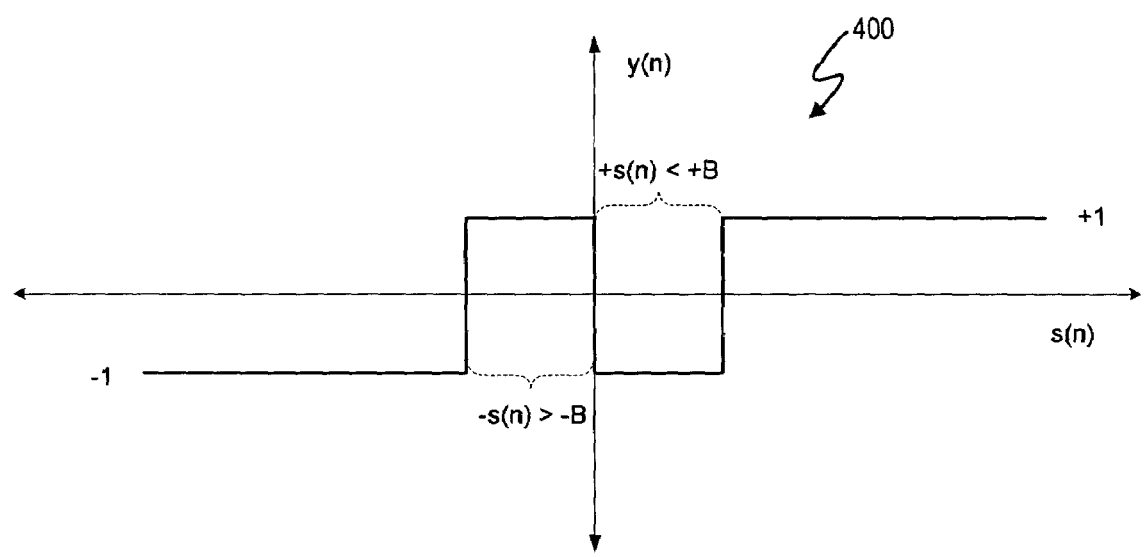
FIG. 4 (labeled prior art) depicts an exemplary single non-monotonic region quantization transfer function for dither emulation.
Figure 5A:
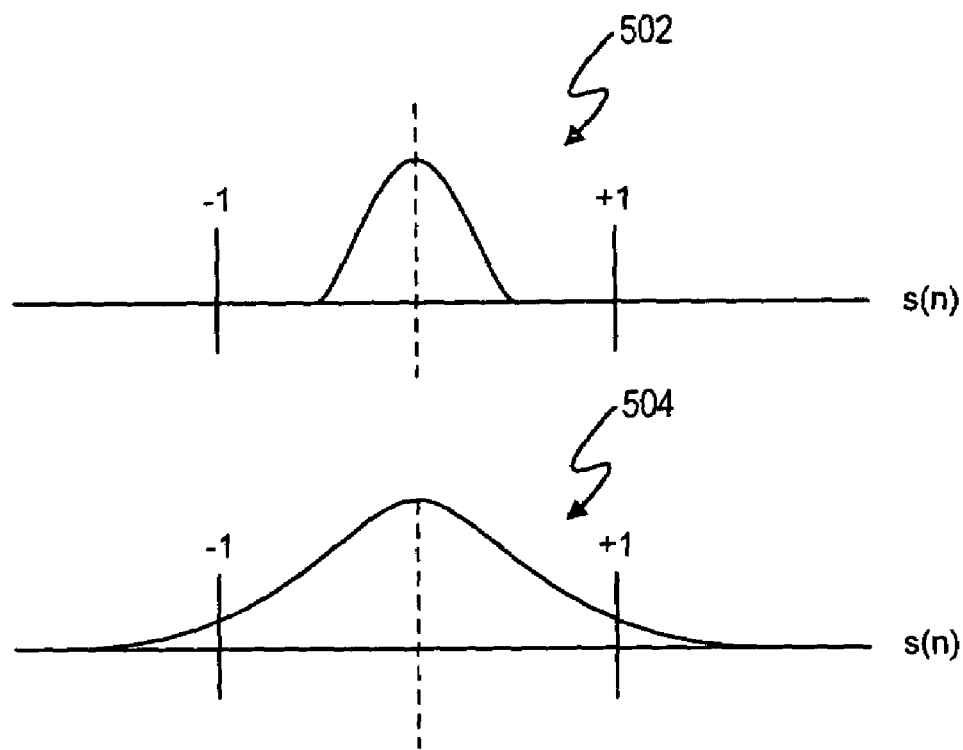
FIG. 5A (labeled prior art) depicts exemplary probability density functions of each quantizer input signal during operation at small and large input signal levels.
Figure 5B:
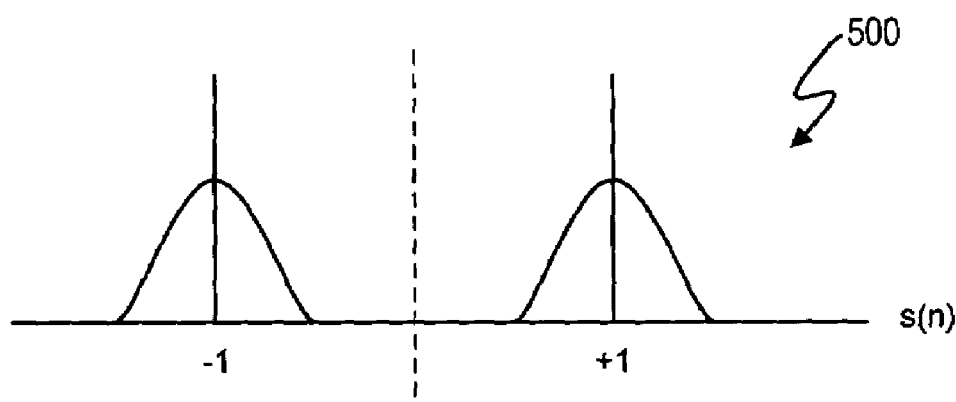
FIG. 5B (labeled prior art) depicts an exemplary near ideal probability density function for each delta sigma modulator quantizer input signal.
Figure 9:
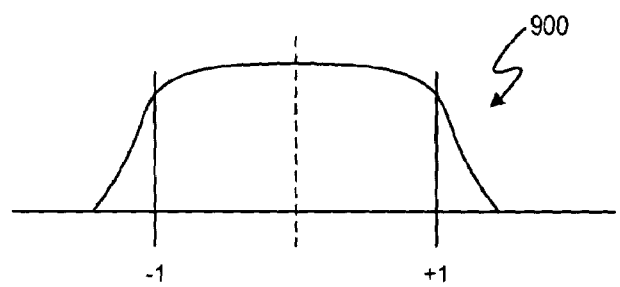
FIG. 9 depicts an exemplary probability density function of each quantizer input signal.

FIG. 9 depicts a PDF 900 of the quantizer input signal s(n) when processed by non-monotonic quantizer 602. Because of the positive feedback for lower level quantizer input signals x(n), the lower level delta sigma modulator input signals x(n) are effectively pushed out and the larger level delta sigma modulator input signals x(n) more closely conform to the ideal PDF depicted in FIG. 5. Thus, the multiple non-monotonic regions quantization transfer function of Equation 2 effectively provides a defined gain for quantizer 602. The delta sigma modulator 600 with non-monotonic quantizer 602 has achieved up to 10 db SNR improvement compared to comparable, conventional delta sigma modulators with monotonic quantizers.

Figure 10:
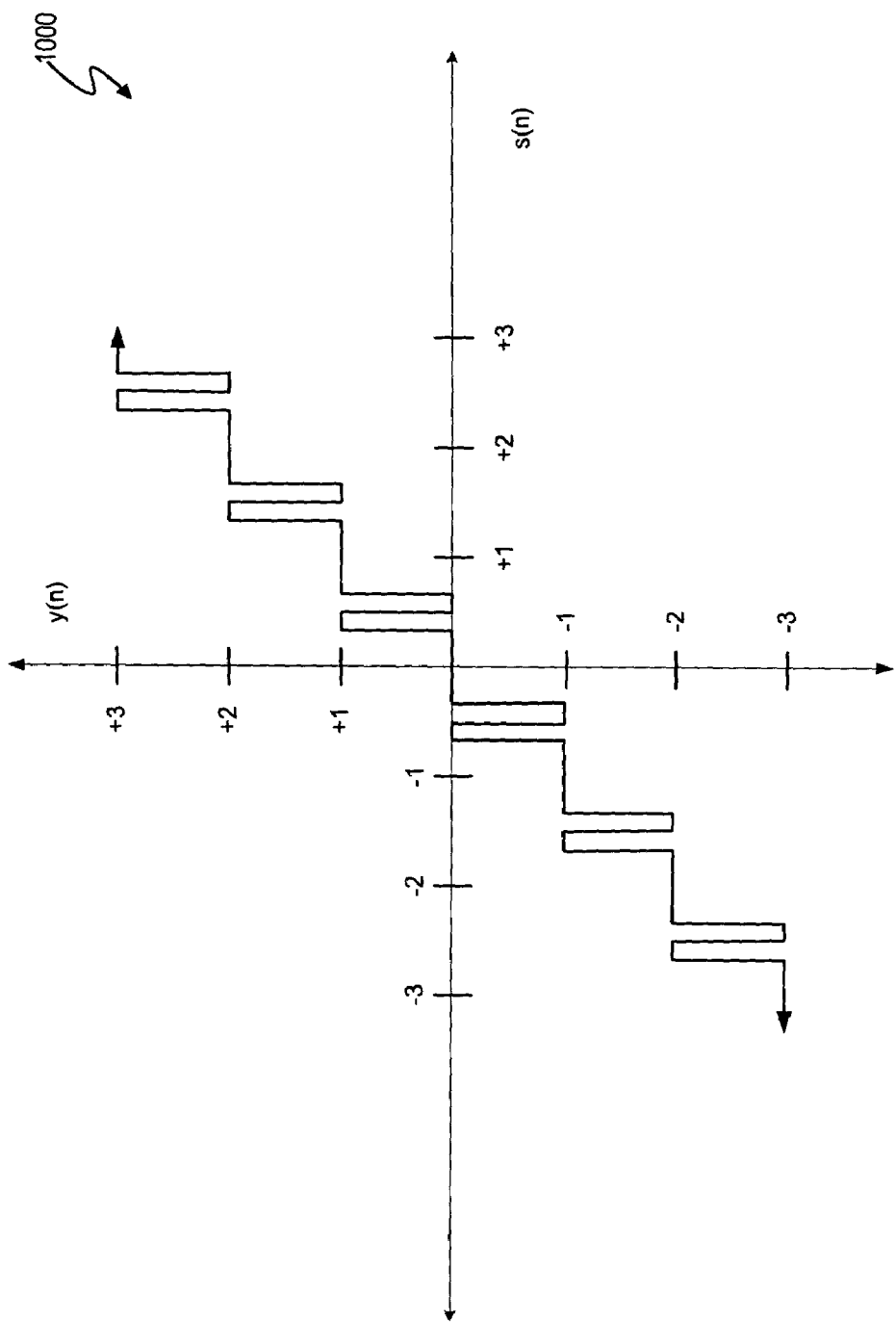
FIG. 10 depicts an exemplary multi-level, non-monotonic quantization transfer function.

FIG. 10 depicts a multi-level, non-monotonic quantization transfer function 1000. The multi-level, non-monotonic quantization transfer function 1000 represents one embodiment of a function implemented by a multi-bit (i.e. multiple quantization level) embodiment of non-monotonic quantizer 602. The multi-level, non-monotonic quantization transfer function 1000 includes at least two transitions per level, and at least one transition involves a slope reversal to provide less negative in the negative quantization or less positive feedback in the positive quantization region. There are numerous other embodiments of the multi-level, non-monotonic quantization transfer function 1000. For example, each level could include three or more transitions, different levels can include different numbers of transitions, and the transitions can provide less negative, less positive, more negative, or more positive feedback. The formulation of multi-level, non-monotonic quantization transfer function 1000 (such as the scale of each non-monotonic region) is a matter of design choice as applied to the particular operational environment and desired quantizer output characteristics.

Figure 11:
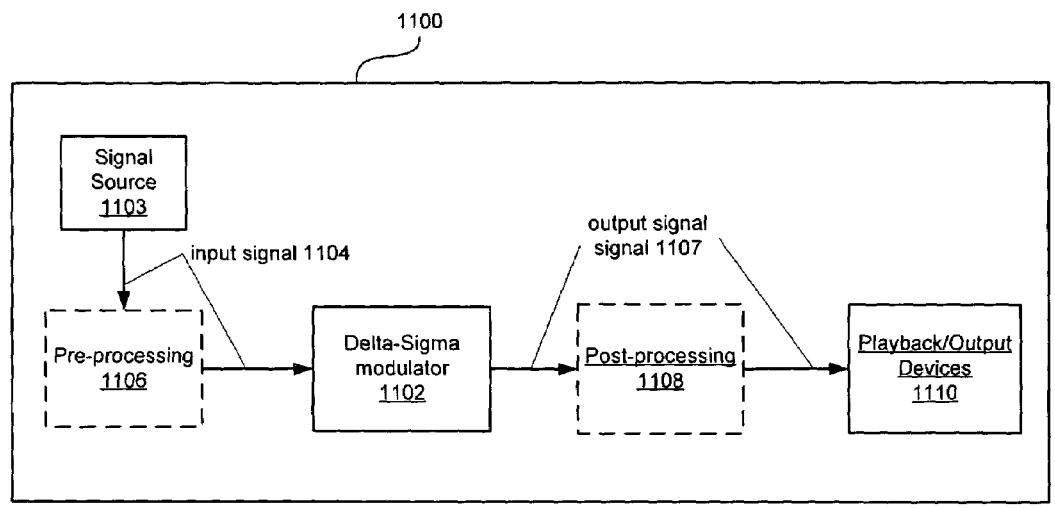
FIG. 11 depicts an exemplary signal processing system that includes a look-ahead modulator, an output device and process, and an output medium.

Referring to FIG. 11, signal processing system 1100 depicts one embodiment of a signal processing system that includes delta sigma modulator 1102. Delta sigma modulator 1102 includes a non-monotonic quantizer and represents an embodiment of delta sigma modulator 600. Signal processing system 1100 is particularly useful for high-end audio applications such as super audio compact disk ("SACD") recording applications. Signal processing system 1100 processes an input signal 1104 generated by an input signal source 1103. The input signal 1104 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1104 may be an audio signal, a video signal, an audio plus video signal, and/or other signal type. Generally, input signal 1104 undergoes some preprocessing 1106 prior to being modulated by delta sigma modulator 1102. For example, pre-processing 1106 can involve an interpolation filter to oversample a digital input signal 1104 in a well-known manner. Pre-processing 1106 can include an analog-to-digital converter to convert an analog input signal 1104 into a digital signal. Pre-processing 1106 can also include mixing, reverberation, equalization, editing, out-of-band noise filtering and other filtering operations.

In the digital domain, pre-processing 1106 provides discrete input signals x[n] to look-ahead modulator 1102. Each discrete input signal x[n] is an N-bit signal, where N is greater than one. As previously described in more detail, delta sigma modulator 1102 processes M input signals x[n] and patterns of M output candidates y[n] to determine an output signal 1107 from the output candidates corresponding to each input signal x[n]. Output signal 1107 is, for example, a collection of one-bit output values. The output signal 1107, thus, becomes an encoded version of the input signal 1104.

Figure 12:
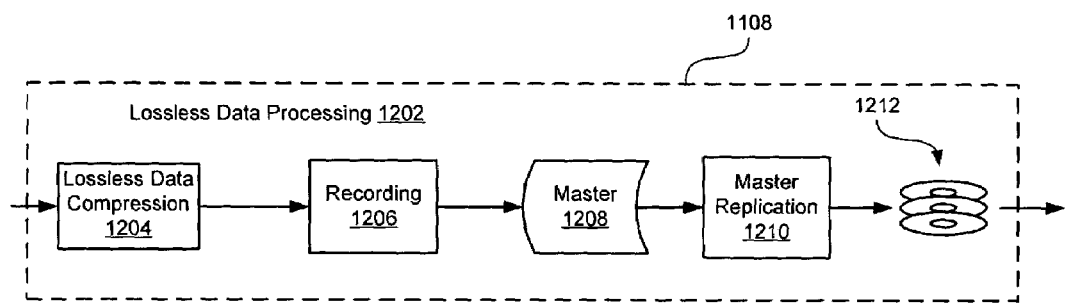
FIG. 12 exemplary depicts post-processing operations in an embodiment of the signal processing system of FIG. 11.

Referring to FIGS. 11 and 12, signal processing system 1100 typically includes post-processing 1108 to post-process the output signal 1107 of look-ahead modulator 1102. Post-processing 1108 can include lossless data processing 1202. For SACD audio mastering, there is a lossless data compression stage 1204, followed by a recording process 1206 that produces the actual pits that are burned into a master storage medium 1208. The master storage medium 1208 is then mechanically replicated to make the disks (or other storage media) 1212 available for widespread distribution. Disks 1212 are, for example, any variety of digital versatile disk, a compact disk, tape, or super audio compact disk. Playback/output devices 1110 read the data from the disks 1212 and provide a signal output in a format perceptible to users. Playback/output devices 1110 can be any output devices capable of utilizing the output signal 1107. Thus, the storage media 1208 and 1212 include data encoded using signal modulation processes achieved using delta sigma modulator 1102.

Although the present invention has been described in detail, it should be understood that various changes, substitutions and alterations can be made hereto without departing from the spirit and scope of the invention as defined by the appended claims.

What is claimed is:

1. A signal processing system comprising:
   a delta sigma modulator comprising:
      a non-monotonic quantizer to quantize an input signal to the quantizer in accordance with a multiple non-monotonic region quantization transfer function.

2. The signal processing system of claim 1 wherein the multiple non-monotonic region quantization transfer function includes quantization level retrograde changeover thresholds symmetrically located around a DC quantizer input signal level +/-⅛ of maximum and minimum quantizer input signal level magnitudes.

3. The signal processing system of claim 1 wherein during operation the multiple non-monotonic region quantization transfer function provides positive feedback to an input signal of the delta sigma modulator for a first set of regions of quantizer input signals and negative feedback to the input signal of the delta sigma modulator for a second set of regions of quantizer input signals.

4. The signal processing system of claim 1 wherein the non-monotonic quantization transfer function comprises:
   components to quantize quantizer input signals in a first quantizer input signal range $s0_i$ at a first quantization level, wherein the quantizer input signals in the signal range $s0_i$ reside in an $i^{th}$ non-monotonic quantizer input signal region $1 \leq i \leq N$, N represents a total number of non-monotonic quantizer input signal regions of the quantization transfer function, and $N \geq 2$;
   components to quantize quantizer input signals in a second quantizer input signal range $s1_i$ at a second quantization level, wherein quantizer input signals in signal range $s1_i$ reside in the $i^{th}$ non-monotonic quantizer input signal region and have magnitudes greater than the first quantizer input signal range $s0_i$, and the second quantization level is greater than the first quantization level;
   components to quantize the quantizer input signals in a third quantizer input signal range $s2_i$ at a third quantization level, wherein quantizer input signals in signal range $s2_i$ reside in the $i^{th}$ non-monotonic quantizer input signal region and have magnitudes greater than the second quantizer input signal range $s1_i$, and the third quantization level is less than the second quantization level; and
   components to quantize quantizer input signals in a fourth quantizer input signal range $s3_i$ at a fourth quantization level, wherein quantizer input signals in signal range $s3_i$ reside in the $i^{th}$ non-monotonic quantizer input signal region and have magnitudes greater than the third quantizer input signal range $s2_i$ and the fourth quantization level is greater than the third quantization level.

5. The signal processing system of claim 4 wherein the second quantization level equals the fourth quantization level and the first quantization level equals the third quantization level.

6. The signal processing system of claim 1 wherein the multiple non-monotonic region quantization transfer function includes multiple quantization thresholds and quantization levels on either side of each threshold are opposite levels.

7. The signal processing system of claim 1 wherein Q(s) represents the non-monotonic quantizer function, and $Q(s0_i)=-1$, $Q(s1_i)=+1$, $Q(s2_i)=-1$, and $Q(s3_i)=+1$ for quantizer input signal ranges $s0_i<s1_i<s2_i<s3_i$, wherein the quantizer input signals in the signal range $s0_i$, $s1_i$, $s2_i$, and $s3_i$ reside in an $i^{th}$ non-monotonic quantizer input signal region $1 \leq i \leq N$, N represents a total number of non-monotonic quantizer input signal regions of the quantization transfer function, and $N \geq 2$.

8. The signal processing system of claim 1 wherein the non-monotonic quantization transfer function reverses quantization for multiple predetermined ranges of the input signal, wherein the multiple ranges are a subset of a total range of the input signal.

9. The signal processing system of claim 1 wherein the non-monotonic quantization transfer function includes multiple quantization thresholds and quantization levels on either side of each threshold are opposite levels.

10. The signal processing system of claim 1 wherein the delta sigma modulator further comprises:
    a loop filter to filter an input signal plus a quantization signal generated by the non-monotonic quantizer.

11. The signal processing system of claim 1 wherein the delta sigma modulator is configured to process an input signal and to provide positive and negative quantization data feedback to the input signal.

12. The signal processing system of claim 1 wherein the quantizer is a one-bit quantizer.

13. A method of non-monotonically quantizing an input signal using a delta sigma modulator, the method comprising:
    quantizing an input signal to a quantizer of the delta sigma modulator in accordance with a multiple non-monotonic region quantization transfer function.

14. The method of claim 13 further comprising:
    receiving input signal samples; and
    wherein quantizing an input signal to a quantizer of the delta sigma modulator in accordance with the multiple non-monotonic region quantization transfer function comprises:
       providing positive feedback to an input signal of the delta sigma modulator for a first set of regions of quantizer input signals and negative feedback to the input signal of the delta sigma modulator for a second set of regions of quantizer input signals.

15. The method of claim 14 wherein the first and second sets of regions of quantizer input signals are nonoverlapping.

16. The method of claim 13 further comprising:
providing one-bit output data for each quantizer input signal.

17. The method of claim 13 further comprising:
receiving input signal samples; and
wherein quantizing an input signal to a quantizer of the delta sigma modulator in accordance with a non-monotonic quantization transfer function comprises:
quantizing a first quantizer input signal range $s0_i$ at a first quantization level, wherein the quantizer input signals in the signal range $s0_i$ reside in an $i^{th}$ non-monotonic quantizer input signal region $1 \leq i \leq N$, N represents a total number of non-monotonic quantizer input signal regions of the quantization transfer function, and $N \geq 2$;
quantizing a second quantizer input signal range $s1_i$ at a second quantization level, wherein quantizer input signals in signal range $s1_i$ reside in the $i^{th}$ non-monotonic quantizer input signal region and have magnitudes greater than the first quantizer input signal range $s0_i$, and the second quantization level is greater than the first quantization level;
quantizing a third quantizer input signal range $s2_i$ at a third quantization level, wherein quantizer input signals in signal range $s2_i$ reside in the $i^{th}$ non-monotonic quantizer input signal region and have magnitudes greater than the second quantizer input signal range $s1_i$, and the third quantization level is less than the second quantization level; and
quantizing a fourth quantizer input signal range $s3_i$ at a fourth quantization level, wherein quantizer input signals in signal range $s3_i$ reside in the $i^{th}$ non-monotonic quantizer input signal region and have magnitudes greater than the third quantizer input signal range $s2_i$ and the fourth quantization level is greater than the third quantization level.

18. The method of claim 17 wherein the second quantization level equals the fourth quantization level and the first quantization level equals the third quantization level.

19. The method of claim 13 wherein the multiple non-monotonic region quantization transfer function includes multiple quantization thresholds and quantization levels on either side of each threshold are opposite levels.

20. The method of claim 13 wherein Q(s) represents the non-monotonic quantizer function, and $Q(s0_i)=-1$, $Q(s1_i)=+1$, $Q(s2_i)=-1$, and $Q(s3_i)=+1$ for quantizer input signal ranges $s0_i<s1_i<s2_i<s3_i$, wherein the quantizer input signals in the signal range $s0_i$, $s1_i$, $s2_i$, and $s3_i$ reside in an $i^{th}$ non-monotonic quantizer input signal region $1 \leq i \leq N$, N represents a total number of non-monotonic quantizer input signal regions of the quantization transfer function, and $N \geq 2$.

21. The method of claim 13 further comprising:
shaping an input signal to the delta sigma modulator to shift noise frequencies out of a signal band of interest.

22. A signal processing system comprising:
an input signal source to generate an input signal;
one or more preprocessing components coupled to the input signal source to process the input signal;
a delta sigma modulator coupled to the one or more preprocessing components to quantize the input signal, wherein the delta sigma modulator comprises:
a noise shaping filter to filter an input signal and a quantizer feedback signal; and
a quantizer coupled to the noise shaping filter to quantize an input signal to the quantizer in accordance with a multiple non-monotonic region quantization transfer function; and
one or more post processing components coupled to the delta sigma modulator to process a quantized input signal.

23. An apparatus comprising:
means for quantizing an input signal to a quantizer of a delta sigma modulator in accordance with a multiple non-monotonic region quantization transfer function.

24. A signal processing system comprising:
a delta sigma modulator comprising:
a one-bit, non-monotonic quantizer having a static quantization transfer function that includes more than three transitions.

25. A method of non-monotonically quantizing an input signal using a delta sigma modulator, the method comprising:
quantizing an input signal to a one-bit quantizer of the delta sigma modulator in accordance with a static quantization transfer function that includes more than three transitions.

* * * * *